United States Patent
Lien

(10) Patent No.: US 6,521,543 B2
(45) Date of Patent: Feb. 18, 2003

(54) MULTIPLE EXPOSURE METHOD

(75) Inventor: Jih-Chang Lien, Taoyuan Hsien (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 09/932,374

(22) Filed: Aug. 17, 2001

(65) Prior Publication Data

US 2002/0127889 A1 Sep. 12, 2002

(30) Foreign Application Priority Data

Mar. 12, 2001 (TW) .......................... 90105690 A

(51) Int. Cl.$^7$ .................. H01L 21/302; H01L 21/461
(52) U.S. Cl. .................. 438/717; 438/759; 430/313; 430/317; 430/325
(58) Field of Search .................. 438/531, 589, 438/947–949, 669, 748, 717, 707, 759; 430/14, 18, 313, 317, 325

(56) References Cited

U.S. PATENT DOCUMENTS 6,316,340 B1 * 11/2001 Hwang et al. .............. 438/524
6,403,431 B1 * 6/2002 Chung et al. ............... 438/296
2002/0068243 A1 * 6/2002 Hwang et al. .............. 430/312

* cited by examiner

Primary Examiner—Wael Fahmy
Assistant Examiner—Hsien Ming Lee
(74) Attorney, Agent, or Firm—Ladas & Parry

(57) ABSTRACT

The present invention provides a multiple exposure method for defining a rectangular pattern on a photoresist layer. The method comprises the following steps. First, a rectangular region is defined on the photoresist layer, having a first margin pair and a second margin pair corresponding to the rectangular pattern. Next, a first exposure process is performed on a first exposure region of the photoresist layer. An extension of the first margin pair acts as a boundary between the first exposure region and the rectangular region. Next, a second exposure process is performed on a second exposure region of the photoresist layer. An extension of the second margin pair acts as a boundary between the second exposure region and the rectangular region. Finally, a development process is performed on the first exposure region and the second exposure region to create the rectangular pattern on a substrate.

10 Claims, 7 Drawing Sheets

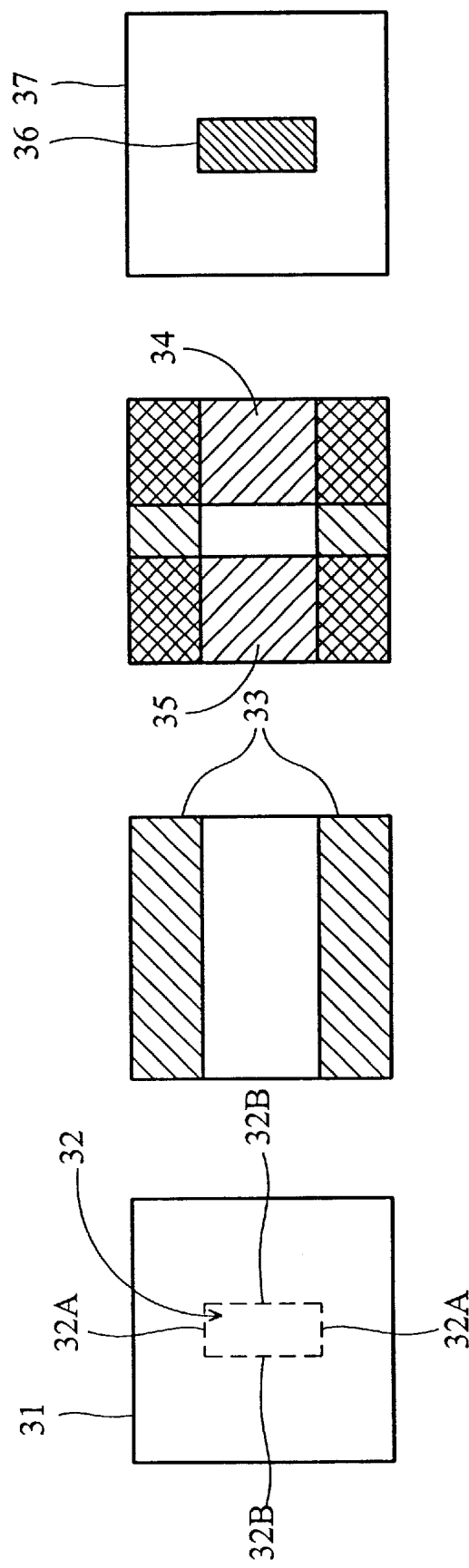

MULTIPLE EXPOSURE METHOD

BACKGROUND OF THE INVENTION

1. Field of the Invention

The present invention relates in general to an exposure method. In particular, the present invention relates to a method of transferring island or hole patterns by performing a plurality of exposures to produce a transfer image closely corresponding to a desired design pattern.

2. Description of the Related Art

In semiconductor production, the process for transferring a mask pattern to a resist material on a semiconductor wafer is referred to as the photolithographic process.

In recent years, along with the increasing miniaturization of the semiconductor devices produced, design rule has become smaller and lithography is being performed near the theoretical lower limit of resolution. This trend is propagating the disadvantages of deterioration in performance of semiconductor devices due to deformation of the transfer pattern and reduction of yield due to bridging (error connection) and disconnection of the patterns.

Referring to FIG. 1, the photomask having a rectangular transparent region is used to transfer a rectangular pattern 12 on a photoresist layer 11. Extreme difficulty exists in creating a transfer image close to the desired rectangular design pattern. The problem stems from the diffraction being more serious when light passes through the rectangular transparent region. Moreover, if a desired pattern is a regular pattern as depicted in FIG. 2, it is more difficult to create a transfer image corresponding to a desired design pattern, because of the diffraction mentioned above.

Accordingly, more effective optical lenses and more complicated controlling procedures are employed to solve these problems of diffraction. However, hardware costs are increased and yield decreased with this type of complicated controlling procedure. In addition, DUV and scanners are used when employing OPC and PSM to define the patterns, but the desired resolution remains unattainable.

SUMMARY OF THE INVENTION

The object of the present invention is to provide a multiple exposure method for solving problems occurring when a rectangular pattern is defined on a photoresist layer. The conventional method for defining a rectangular pattern uses a photomask having a rectangular transparent region to transfer the pattern directly. However, the present invention provides a method that exposes the photoresist around the pattern to be transferred, achieving the desired resolution of pattern. Additionally, the types of photoresist are positive photoresist and negative photoresist. The negative photoresist generates cross-linkings when lit, so the negative photoresist will not dissolve in developer. The positive photoresist is decomposed by lighting, so the positive photoresist will dissolve in developer. By using photoresists of different types, the hole or island structures of the photoresist are formed.

According to the method provided by the present invention, the size of the exposure region is larger than the rectangular transparent region. Therefore, problems of poor resolution caused by the diffraction of light are solved.

To achieve the above-mentioned object, the present invention provides a multiple exposure method for defining a rectangular pattern on a photoresist layer. The method comprises the following steps. First, a rectangular region is defined on the photoresist layer, the rectangular region having a first margin pair and a second margin pair corresponding to the rectangular pattern. Next, a first exposure process is performed on a first exposure region of the photoresist layer. An extension of the first margin pair acts as a boundary between the first exposure region and the rectangular region. Next, a second exposure process is performed on a second exposure region of the photoresist layer. An extension of the second margin pair acts as a boundary between the second exposure region and the rectangular region. Finally, a development process is performed on the first exposure region and the second exposure region to create the rectangular pattern on a substrate.

BRIEF DESCRIPTION OF THE DRAWINGS

The present invention will become more fully understood from the detailed description given hereinbelow and the accompanying drawings, given by way of illustration only and thus not intended to be limitative of the present invention.

FIGS. 4A~4D are flow charts showing the steps of exposing a photoresist according to the second embodiment of the present invention.

DETAILED DESCRIPTION OF THE PREFERRED EMBODIMENT

The embodiments of the present invention are described with single rectangular pattern to be transferred. This should not limit the scope of the present invention. Any other regular patterns may also be adopted under the same application.

First Embodiment

FIG. 3A to FIG. 3D are flow charts showing the steps of exposing a photoresist according to the first embodiment of the present invention.

Figures 3A, 3B, 3C, 3D:
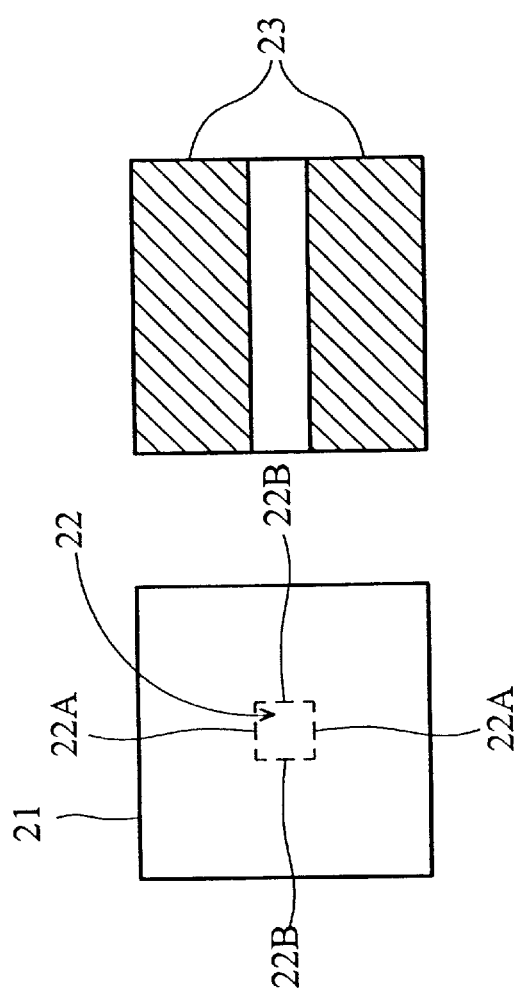
FIGS. 3A~3D are flow charts showing the steps of exposing a photoresist according to the first embodiment of the present invention.

First, referring to FIG. 3A, a rectangular region 22 having a first margin pair 22A and a second margin pair 22B is defined on a photoresist layer 21. The shape of the rectangular region 22 is mostly similar to the shape of the pattern to be transferred. In addition, the rectangular region 22 is utilized only to illustrate the description. In the actual application, it is possible to perform the steps as described below. Referring to FIG. 3B, a first exposure process is performed on a first exposure region 23 of the photoresist layer 21. Here, an extension of the first margin pair 22A acts as a boundary between the first exposure region 23 and the rectangular region 22. Then, a second exposure process is performed on a second exposure region 24 of the photoresist layer 21. Here, an extension of the second margin pair 22B acts as a boundary between the second exposure region 24 and the rectangular region 22.

Finally, the first exposure region 23 and the second exposure region 24 are developed to create the rectangular pattern 25 on a substrate 26 (referring to FIG. 3D). In the present embodiment, if the photoresist layer 21 is a positive photoresist, the rectangular pattern 25 generated on the photoresist layer 21 is a hole structure. On the contrary, if the photoresist layer 21 is a negative photoresist, the rectangular pattern 25 generated on the photoresist layer 21 is an island structure.

Second Embodiment

FIG. 4A to FIG. 4D are flow charts showing the steps of exposing a photoresist according to the second embodiment of the present invention.

First, referring to FIG. 4A, a rectangular region 32 having a first margin pair 32A and a second margin pair 32B is defined on a photoresist layer 31. The second margin pair 32B is longer than a first margin pair 32A. The shape of the rectangular region 32 is mostly similar to the shape of the pattern to be transferred. In addition, the rectangular region 32 is utilized only to illustrate the description. In the actual application, it is possible to perform the steps as described below. Referring to FIG. 4B, a first exposure process is performed on a first exposure region 33 of the photoresist layer 31. Here, an extension of the first margin pair 32A acts as a boundary between the first exposure region 33 and the rectangular region 32. Then, a second exposure process is performed on a second exposure region 34 of the photoresist layer 31. Here, an extension of the second margin pair 32B acts as a boundary between the second exposure region 34 and the rectangular region 32. Next, a third exposure process is performed on a third exposure region 35 of the photoresist layer 31. Here, an extension of the second margin pair 32B acts as a boundary between the third exposure region 35 and the rectangular region 32. In the present embodiment, the reason for performing the third and second exposure process at different times is to avoid the second exposure region 34 and the third exposure region 35 being too close, which may adversely affect the resolution of the pattern.

Finally, the first exposure region 33, the second exposure region 34, and the third exposure region 35 are developed to create the rectangular pattern 36 on a substrate 37 (refer to FIG. 4D). In the present embodiment, if the photoresist layer 31 is a positive photoresist, the rectangular pattern 36 generated on the photoresist layer 31 is a hole structure. On the contrary, if the photoresist layer 31 is a negative photoresist, the rectangular pattern 36 generated on the photoresist layer 31 is an island structure.

Third Embodiment

FIG. 5A to FIG. 5F are flow charts showing the steps of exposing a photoresist according to the third embodiment of the present invention.

Figure 5C:
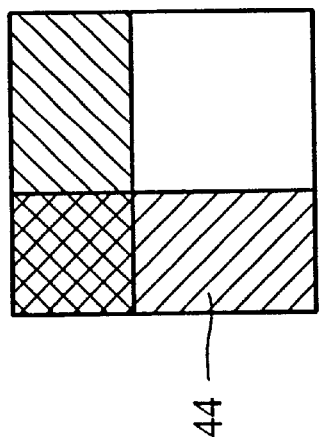
FIGS. 5A~5F are flow charts showing the steps of exposing a photoresist according to the third embodiment of the present invention.
Figure 5B:
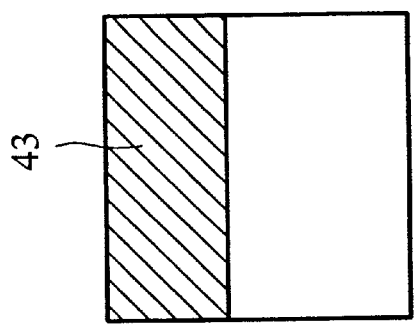
Figure 5A:
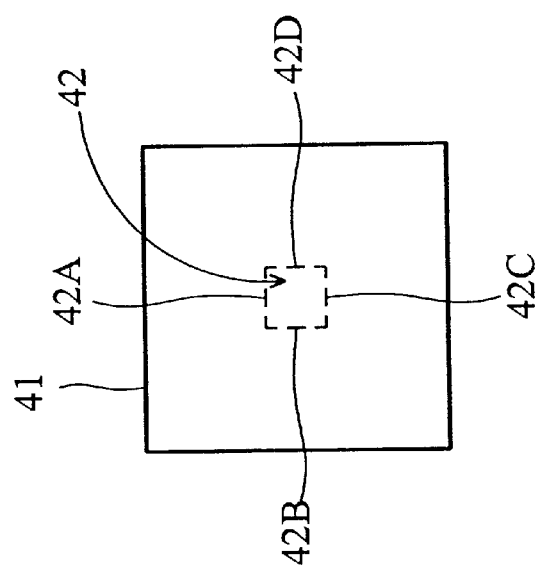

First, referring to FIG. 5A, a rectangular region 42 having four margins 42A~42D is defined on a photoresist layer 41. The shape of the rectangular region 42 is similar to the shape of the pattern to be transferred. In addition, the rectangular region 42 is utilized only to illustrate the description. In the actual application, it is possible to perform the steps as described below.

Referring to FIG. 5B, a first exposure process is performed on a first exposure region 43 of the photoresist layer 41. Here, an extension of the first margin 42A acts as a boundary between the first exposure region 43 and the rectangular region 42. Next, referring to FIG. 5C, a second exposure process is performed on a second exposure region 44 of the photoresist layer 41. Here, an extension of the second margin 42B acts as a boundary between the second exposure region 44 and the rectangular region 42.

Figure 5F:
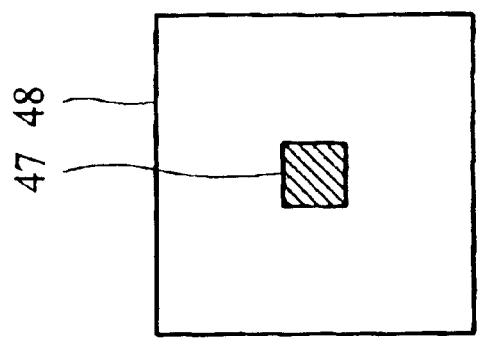
Figure 5E:
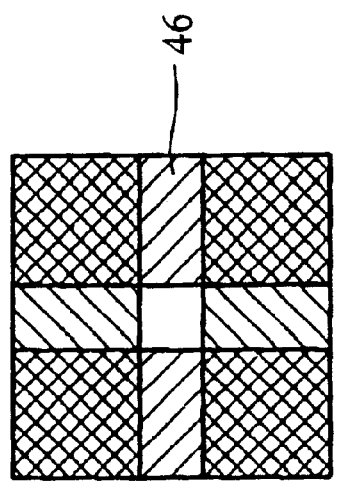
Figure 5D:
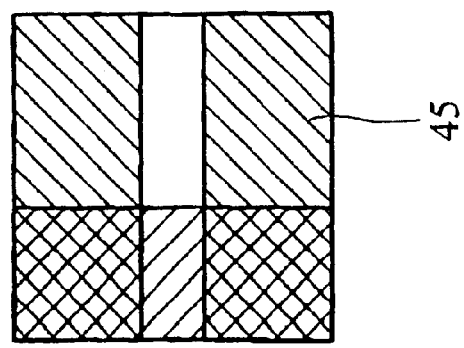

Next, referring to FIG. 5D, a third exposure process is performed on a third exposure region 45 of the photoresist layer 41. Here, an extension of the third margin 42C acts as a boundary between the third exposure region 45 and the rectangular region 42.

Next, referring to FIG. 5E, a fourth exposure process is performed on a fourth exposure region 46 of the photoresist layer 41. Here, an extension of the fourth margin 42D acts as a boundary between the fourth exposure region 46 and the rectangular region 42.

Finally, the first exposure region 43, the second exposure region 44, the third exposure region 45 and the fourth exposure region 46 are developed to create the rectangular pattern 47 on a substrate 48 (referring to FIG. 5F). In the present embodiment, if the photoresist layer 41 is a positive photoresist, the rectangular pattern 47 generated on the photoresist layer 41 is a hole structure. On the contrary, if the photoresist layer 41 is a negative photoresist, the rectangular pattern 47 generated on the photoresist layer 41 is an island structure.

Figure 1:
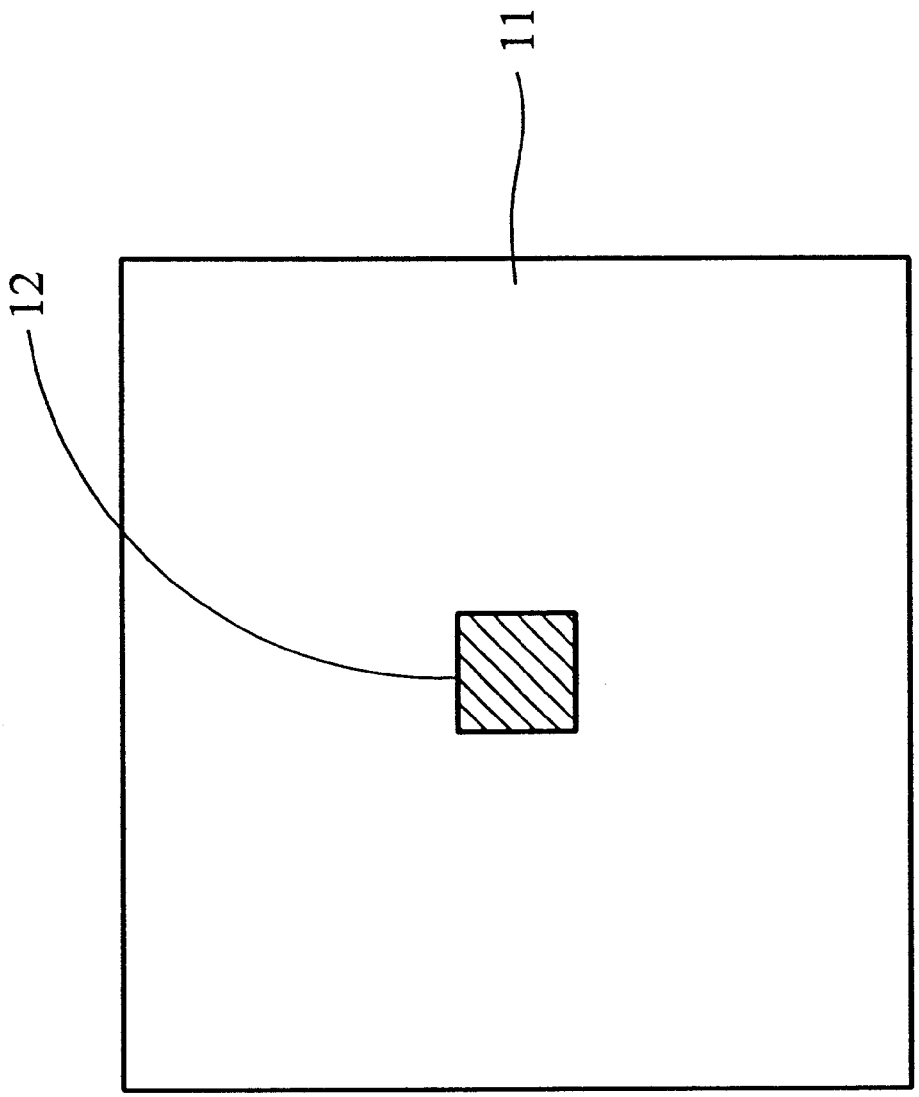
FIG. 1 is a schematic view showing a rectangular pattern to be transferred.
Figure 2:
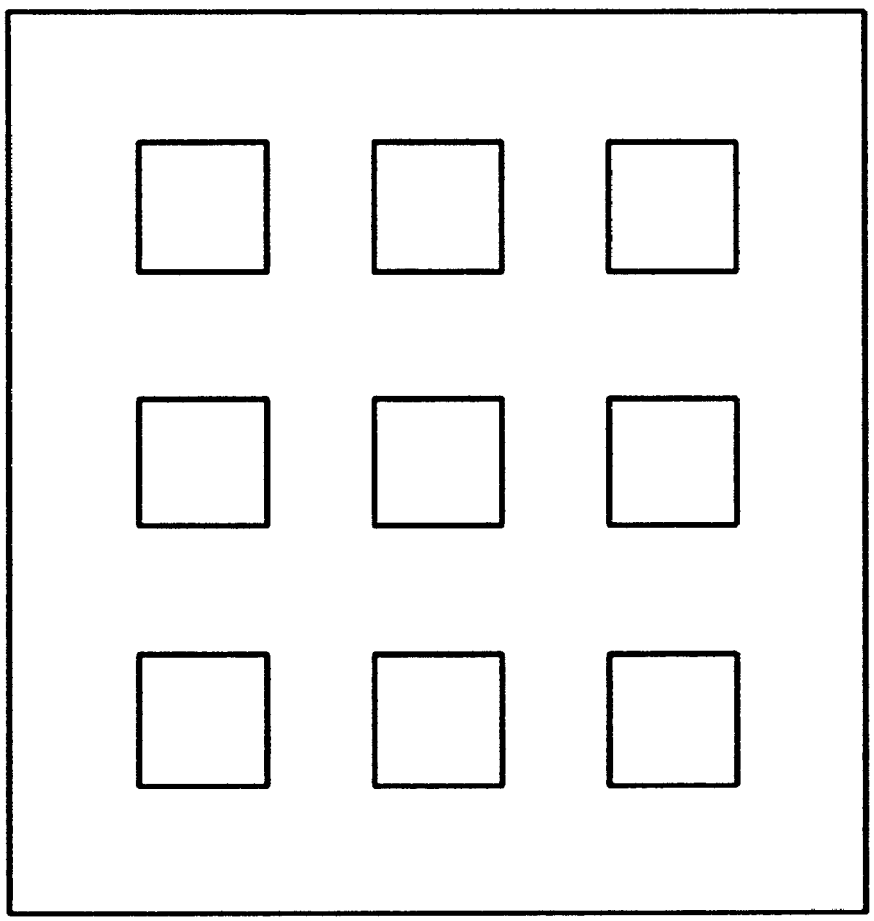
FIG. 2 is a schematic view showing a regular pattern to be transferred.
Figure 6A:
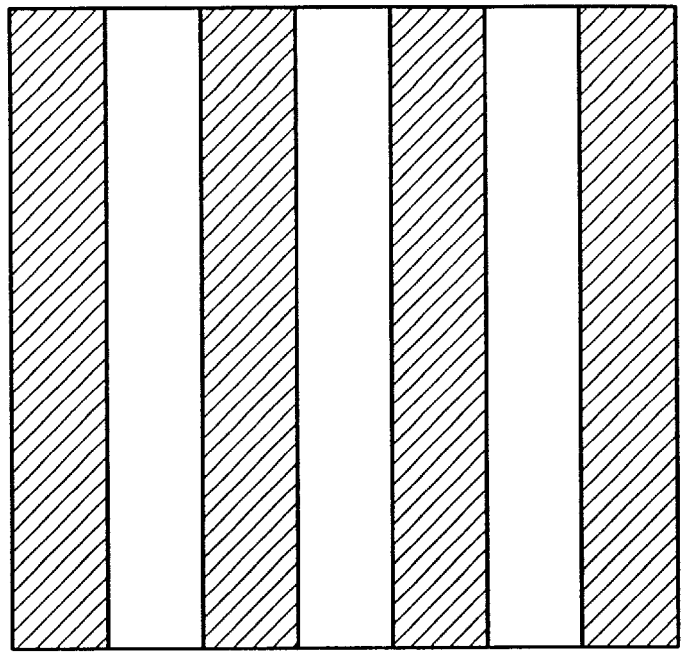
FIGS. 6A and 6B are schematic views showing the photomask with rectangular patterns having been created according to another embodiment.
Figure 6B:
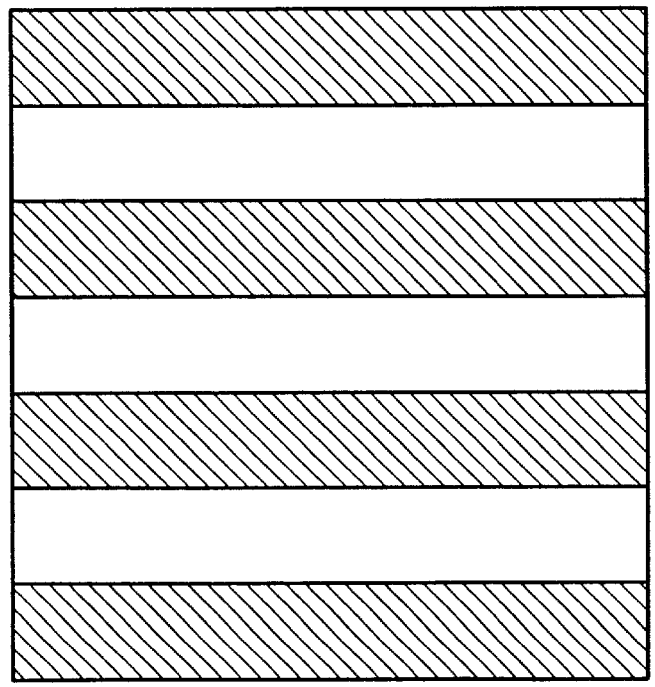

Moreover, according to the present invention, the rectangular patterns shown in FIG. 2 are transferred using the photomasks shown in FIG. 6A and FIG. 6B one after another. This type of the photomask has a large transparent part; therefore, the effect of light diffraction is not apparent. In the present invention, the photomasks are overlapped to expose the same photoresist respectively, so the patterns shown in FIG. 2 are created on a substrate.

According to the method provided by the present invention, the size of the exposure region is larger than the rectangular transparent region. Therefore, the problems of poor resolution caused by the diffraction of light are solved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A multiple exposure method for defining a rectangular pattern on a photoresist layer, comprising the following steps:

defining a rectangular region having a first margin pair and a second margin pair longer than the first margin pair corresponding to the rectangular pattern on the photoresist layer;

performing a first exposure process on a first exposure region of the photoresist layer, wherein an extension of the first margin pair acts as a boundary between the first exposure region and the rectangular region;

performing a second exposure process and a third exposure process on a second exposure region and a third exposure region of the photoresist layer respectively, wherein an extension of the second margin pair acts as a boundary between the second exposure region and the rectangular region and a boundary between the third exposure region and the rectangular region; and performing a development process on the first exposure region, the second exposure region and the third exposure region to create the rectangular pattern on a substrate.

2. The multiple exposure method as claimed in claim 1, wherein the photoresist layer is a positive photoresist.

3. The multiple exposure method as claimed in claim 2, wherein the rectangular pattern is a hole structure.

4. The multiple exposure method as claimed in claim 1, wherein the photoresist layer is a negative photoresist.

5. The multiple exposure method as claimed in claim 4, wherein the rectangular pattern is a island structure.

6. A multiple exposure method for defining a rectangular pattern on a photoresist layer, comprising the following steps:

defining a rectangular region having a first margin, a second margin, a third margin, and a fourth margin on the photoresist layer;

performing a first exposure process on a first exposure region of the photoresist layer, wherein an extension of the first margin acts as a boundary between the first exposure region and the rectangular region;

performing a second exposure process on a second exposure region of the photoresist layer, wherein an extension of the second margin acts as a boundary between the second exposure region and the rectangular region;

performing a third exposure process on a third exposure region of the photoresist layer, wherein an extension of the third margin acts as a boundary between the third exposure region and the rectangular region;

performing a fourth exposure process on a fourth exposure region of the photoresist layer, wherein an extension of the fourth margin acts as a boundary between the fourth exposure region and the rectangular region; and performing a development process on the first exposure region, the second exposure region, the third exposure region and the fourth exposure region to create the rectangular pattern on a substrate.

7. The multiple exposure method as claimed in claim 6, wherein the photoresist layer is a positive photoresist.

8. The multiple exposure method as claimed in claim 7, wherein the rectangular pattern is a hole structure.

9. The multiple exposure method as claimed in claim 6, wherein the photoresist layer is a negative photoresist.

10. The multiple exposure method as claimed in claim 9, wherein the rectangular pattern is a island structure.

* * * * *